Feb. 9, 1965 C. E. M. TIBBS 3,169,230

DIELECTRIC HEATING APPARATUS WITH AUTOMATIC TUNABLE RESONANT CIRCUIT

Filed July 7, 1960

Inventor
CHRISTOPHER E. M. TIBBS

By
Kemon, Palmer, Stewart & Estabrook
Attorneys

United States Patent Office
3,169,230
Patented Feb. 9, 1965

3,169,230

DIELECTRIC HEATING APPARATUS WITH AUTOMATIC TUNABLE RESONANT CIRCUIT

Christopher Evan Mundell Tibbs, Earley, England, assignor to Radio Heaters Limited, Wokingham, England, a British company Filed July 7, 1960, Ser. No. 41,307
Claims priority, application Great Britain, July 10, 1959, 23,809/59
8 Claims. (Cl. 331—9)

In the design of high frequency dielectric heating apparatus, care must be given to the reduction of the radiation of electrical interference and to the restriction of such interference to the smallest possible frequency band. This problem is rendered more difficult by the fact that the resonant frequency of the output circuit of the apparatus varies considerably with different workpieces and also varies during the heating of a single workpiece owing to the change in electrical characteristics of the workpiece as its temperature rises. In free-running oscillators this results in considerable variation of frequency unless steps are taken to adjust the tuning. It is therefore desirable to provide means for retuning the oscillator of the equipment for different workpieces and also during the heating of a single workpiece in order to maintain the operating frequency as close as possible to a predetermined value. We have found that it is possible to tune the oscillator automatically against a reference frequency provided by a crystal oscillator, and that this provides a satisfactory solution for some kinds of equipment. It is not satisfactory, however, for some other kinds of apparatus in which the characteristics of the load change so rapidly that in spite of the automatic tuning control the oscillator would spend an appreciable amount of the total operating time outside a frequency range of $\pm 0.05\%$ at 40.68 mc./s. As an example, a plastic sheet welder might have a short welding cycle of only ½ of a second, during which the resonant frequency of the load might change in the ratio of ten to one.

According to the present invention the apparatus comprises a radio frequency oscillator of high frequency stability including an output stage with a tunable tank circuit, means which cyclically varies the resonant frequency of the tunable tank circuit about its mean frequency by a predetermined amount, and tuning means responsive to a change in output at one or both of the extreme frequencies of the cyclic variation, resulting from a departure of the mean resonant frequency from the oscillator frequency, to adjust the tunable tank circuit so that its mean resonant frequency is restored in the direction of the oscillator frequency. The tuning means may include a step-by-step motor adjusting a variable element in a direction dependent on the departure of the output of the tunable circuit from a limiting value at one extreme frequency of the cyclic variation. In an alternative form, signals derived from the tunable circuit at the lowest and highest points of the cyclic frequency variation are rectified and combined to produce a difference signal which serves to control the tuning means.

In this way, not only is frequency stability achieved by the use of a high stability oscillator, but in addition the tuning of the tank circuit is maintained within predetermined limits, thereby improving the efficiency of the apparatus. Although in most cases the high stability oscillator will be crystal-controlled, in some applications it is possible to use a cavity-controlled oscillator.

In order that the invention may be better understood, two embodiments will now be described with reference to the accompanying drawings, in which.

Figure 1:
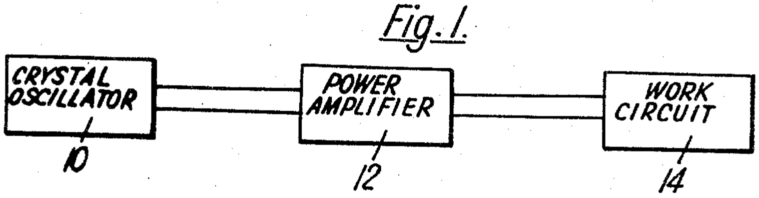
FIGURE 1 is a block circuit diagram of the apparatus.
Figures 2, 3:
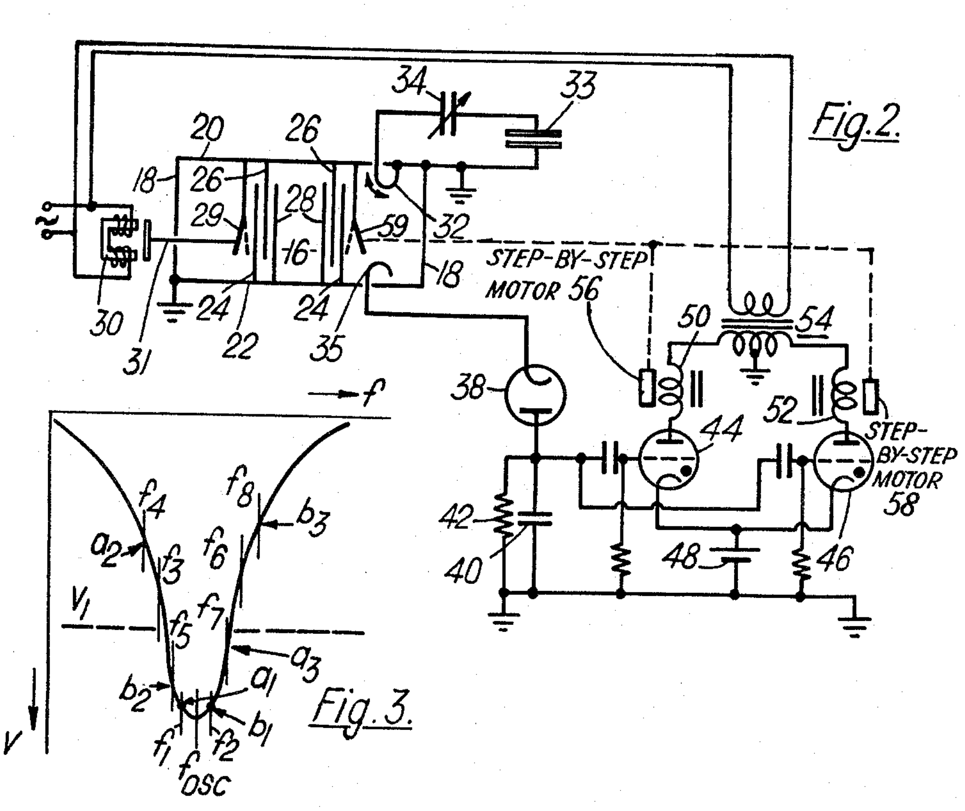
FIGURE 2 shows the tank circuit of the power amplifier and the tuning means.
FIGURE 3 is a diagram illustrating the operation of the tuning means.

In FIGURE 1 the crystal oscillator 10 drives a power amplifier 12 the output of which is applied to a work circuit 14. In FIGURE 2 the tank circuit 16 of the power amplifier is shown in the form of a cavity resonator having a cylindrical outer casing 18 provided with end plates 20 and 22 and having an inner capacitance unit consisting of three concentric cylinders 24, 26 and 28, each of which has a length slightly less than that of the cylinder 18 and which are connected alternately to the end plates 20 and 22. A section of variable capacitance is included in the tank circuit and is provided by a reed 29 which is vibrated at mains frequency by a polarised armature 30, through the push-rod 31. An adjustable coupling loop 32 provides power for the work circuit which comprises the welding tool 33 and the output circuit tuning condenser 34. A variable pick-up coil 35 applies an output signal from the cavity to the cathode of a diode 38, the anode of which is connected to a capacitor 40 in parallel with a resistor 42. The time constant of these components is chosen so that the radio frequency signal will be removed while the 50-cycle waveform due to the vibrating reed 29 will be substantially unaffected. The negative voltage across the capacitor 40 is applied in parallel to the input circuits of two thyratrons 44 and 46 which are biased by a common battery 48. The anodes of the two thyratrons are coupled through coils 50 and 52, respectively, to the secondary winding of a mains transformer 54, the centre tapping of the secondary winding being earthed. The coils 50 and 52 are the energising coils for two step-by-step motors 56 and 58 which serve to adjust a variable capacitor within the cavity, formed between the cylinder 24 and a movable flap 59, in order to tune the cavity frequency in opposite directions.

The operation of this circuit will be described in connection with FIGURE 3. This figure shows a characteristic representing the variation of the voltage developed across the tank circuit and pick-up coil 35 due to variations in tank circuit resonant frequency as a result of "pulling" due to the changes in the work circuit. The maximum voltage is developed across the tank circuit when the resonant frequency of the latter is equal to the frequency of the crystal which controls the frequency applied to the tank circuit. When the mean resonant frequency of the tank circuit has this value the effect of the vibrating reed will be to swing the resonant frequency between the limits $f_1$ and $f_2$ of FIGURE 3, and consequently at the extreme values of the cyclic frequency variation, equal voltages $a_1$ and $b_1$ will be applied to the rectifier 38. When the mean resonant frequency of the tank circuit is too low and has, for example, the value $f_3$, the extremes of the cyclic frequency variation will be the frequencies $f_4$ and $f_5$ corresponding to voltages $a_2$ and $b_2$. In a similar way when the mean resonant frequency has a value $f_6$ which is greater than the oscillator frequency the extremes of the cyclic frequency variation will be $f_7$ and $f_8$ corresponding to voltages $a_3$ and $b_3$. The phase of the alternating voltages which are applied to the anodes of the two thyratrons 44 and 46 is such that one anode will have its peak positive voltage when the vibrating reed 29 is in one extreme position and the other anode will have its peak positive voltage when the vibrating reed is in its other extreme position. The value of the bias applied to the thyratrons is such that each thyratron can conduct for a brief period when its anode receives the peak positive voltage if the negative voltage applied to the thyratron grid from the capacitor 40 becomes less negative than a predetermined value. This predetermined value is represented in FIGURE 3 by the line $V_1$. Thus, when the mean resonant frequency of the tank circuit is substantially correct both voltages $a_1$ and $b_1$ are below the predetermined value $V_1$ and the thyratrons do not conduct. When the mean resonant frequency has the value $f_3$ the thyratron which receives the peak anode voltage when the capacitor 40 receives the voltage $a_2$ conducts, but the other thyratron, which receives the voltage $b_2$ when its anode receives the peak positive voltage, does not conduct. The conducting thyratron will be extinguished as soon as the anode voltage falls below a given value. The pulse of current which flows through the corresponding coil 50 or 52 will cause the step-by-step motor to adjust the tuning capacitor 59 through one step in a direction such that the mean resonant frequency of the work circuit is moved towards the oscillator frequency.

In a similar manner when the mean resonant frequency has a value $f_6$, the other thyratron will conduct since it will receive a voltage $b_3$ which is above the predetermined value $V_1$ when its anode has the peak positive value. As a result the other step-by-step motor will be energised and will move the variable capacitor 59 in the opposite direction.

In this way, although the resonant frequency of the tank circuit is continuously varying between the limits $f_1$ and $f_2$, it does not vary outside predetermined limits which are established by the selected voltage $V_1$. As a result the tuning of the tank circuit is always within a certain frequency range centred on the crystal frequency and as a result the heat dissipation at the anode of the power amplifier valve is never excessive.

As an example, in apparatus having a tank circuit for which the working Q is 250, a suitable frequency swing would be from 0.01% to 0.4% of the operating frequency of the equipment.

A reactance valve can also be used for the frequency wobbulation of the tank circuit tuning. In this case it is arranged that the signal which causes the reactance valve to vary the frequency also operates the grid circuit of one rectifier valve at one extreme frequency and that of the other rectifier valve at the other extreme frequency.

The crystal oscillator and the power output valve are enclosed within a screened compartment to reduce harmonic radiation, and the leads into the screened compartment are filtered to reduce the escape of harmonic radiation through these leads. The tank output circuit is also within a screened enclosure, which may be combined with that enveloping the output valve. It is also desirable to include harmonic filters in the valve anode lead and also in the output lead, and the output may be inductively coupled to a separately tuned work circuit with a Faraday screen interposed between the output circuit and the tuned work circuit.

We have found that a reduction of the harmonic radiation from the equipment can be obtained by using a push-pull cavity power amplifier stage, as described in our co-pending British application No. 21564/60. In this circuit, the push-pull triodes are driven from the ends of a push-pull input transformer, and their anodes are connected through coupling capacitors with adjacent cylinders of the central capacitance unit within the cavity tank circuit, the adjacent cylinders constituting opposite electrodes of the central capacitance unit. The cathodes of the two triodes are connected to opposite end plates of the cavity, and an output pick-up loop emerges through the cylindrical side wall of the latter. The coefficient of inductive coupling between the tank circuit and the work circuit preferably has a low value which does not exceed the critical coupling by a factor of more than 20, and preferably not by a factor of more than 5.

I claim:

1. Dielectric heating apparatus comprising: a radio frequency oscillator stage of high frequency stability; an output stage driven from said oscillator stage and having a tunable tank circuit; means which cyclically varies the resonant frequency of said tunable tank circuit about its mean frequency by a predetermined amount; and tuning means responsive to changes in the output levels of the tank circuit at the two extreme frequencies of said cyclic variation, resulting from the departure of the mean resonant frequency from the oscillator frequency, to adjust said tunable tank circuit so that its mean resonant frequency is restored in the direction of the oscillator frequency 2. Apparatus according to claim 1, in which said tank circuit includes a tunable element in the form of a variable capacitor including a vibratable reed.

3. Apparatus according to claim 1, in which the tunable circuit is adjusted by a step-by-step motor controlled by a relay device operated at one extreme frequency of the frequency sweep.

4. Apparatus according to claim 3, including two step-by-step motors for adjusting the tunable circuit in opposite directions, the energising coils of the step-by-step motors being pulsed by means of thyratrons operative at opposite ends of the frequency sweep.

5. Apparatus according to claim 1, in which signals derived from the tunable circuit at the lowest and highest points of the frequency variation are combined to provide a difference signal which serves to control the tuning means.

6. Apparatus according to claim 1, in which the tunable circuit incorporates as a tuning element a vibrating reed.

7. Dielectric heating apparatus comprising: a radio frequency oscillator stage of high frequency stability; an output stage driven from said oscillator stage; a tank circuit in said output stage, including two tunable elements therein; means which continuously and cyclically adjusts one of said tunable elements to vary the resonant frequency of the tank circuit about its mean frequency by a predetermined amount; further means for adjusting the other of said tunable elements to vary the mean frequency of said cyclic variation of frequency of the tank circuit; and tuning means responsive to changes in the output levels of said tank circuit at the two extreme frequencies of the cyclic variation, resulting from a departure of the mean resonant frequency from the oscillator frequency, to operate said further adjusting means to restore the mean resonant frequency of the tank circuit in the direction of the oscillator frequency.

8. Dielectric heating apparatus comprising: a radio frequency oscillator stage of high frequency stability; an output stage driven from said oscillator stage; a cavity resonator in the anode circuit of said output stage; two variable elements in said cavity resonator; means which continuously and cyclically adjusts one of said variable elements to vary the resonant frequency of said cavity resonator about its mean frequency by a predetermined amount; further means for adjusting the other of said variable elements to vary the mean frequency of said cyclic variation of frequency of said cavity resonator; pick-up means coupled to said resonator for obtaining a cyclically varying control voltage of which the peak values in each cycle occur at the extremes of said cyclic frequency variation; and tuning means responsive to said control voltage only when said peak values exceed a predetermined amount to operate said further adjusting means to restore the mean resonant frequency of said cavity resonator in the direction of the oscillator frequency.

References Cited in the file of this patent

UNITED STATES PATENTS

| | | |
|---|---|---|
| 2,415,799 | Reifel et al. | Feb. 11, 1947 |
| 2,508,321 | Wilmotte | May 16, 1950 |
| 2,564,059 | Gensel | Aug. 14, 1951 |